(12) United States Patent
Nakata

(10) Patent No.: US 6,744,073 B1
(45) Date of Patent: Jun. 1, 2004

(54) LIGHT-EMITTING OR LIGHT-RECEIVING SEMICONDUCTOR DEVICE AND METHOD FOR FABRICATING THE SAME

(76) Inventor: Josuke Nakata, 112-17, Kamlootani, Kuse, Jyoyo, Kyoto 610-0102 (JP)

( * ) Notice: Subject to any disclaimer, the term of this patent is extended or adjusted under 35 U.S.C. 154(b) by 0 days.

(21) Appl. No.: 10/168,810

(22) PCT Filed: Oct. 20, 2000

(86) PCT No.: PCT/JP00/07359

§ 371 (c)(1),
(2), (4) Date: Jun. 20, 2002

(87) PCT Pub. No.: WO02/35612

PCT Pub. Date: May 2, 2002

(51) Int. Cl.⁷ .......................... H01L 27/15; H01L 31/12; H01L 33/00
(52) U.S. Cl. .............................. 257/81; 257/82; 257/88; 257/91; 257/99
(58) Field of Search ............................. 257/81, 82, 88, 257/91, 99, 459, 79

(56) References Cited

U.S. PATENT DOCUMENTS

| | | | |
|---|---|---|---|
| 4,100,051 A | * | 7/1978 | Kilby et al. ................ 204/266 |
| 4,691,076 A | | 9/1987 | Levine et al. |
| 4,913,744 A | * | 4/1990 | Hoegl et al. ................. 136/244 |
| 6,204,545 B1 | * | 3/2001 | Nakata ........................ 257/459 |
| 6,355,873 B1 | * | 3/2002 | Ishikawa .................... 136/250 |

FOREIGN PATENT DOCUMENTS

| | | |
|---|---|---|
| JP | 51-6686 | 1/1976 |
| JP | 52-17229 | 2/1977 |
| JP | 5-36997 | 2/1993 |
| JP | 9-162434 | 6/1997 |
| WO | PC-99/10935 | 3/1999 |

* cited by examiner

Primary Examiner—David Nelms
Assistant Examiner—Tu-Tu Ho
(74) Attorney, Agent, or Firm—Darby & Darby

(57) ABSTRACT

A semiconductor device (10) having light-receiving functions can include, for example: a semiconductor element (1) formed from a p-type silicon single crystal: first and second flat surfaces (2, 7); a n-type diffusion layer (3) and a pn junction (4) thereof; a recrystallized layer (8); a reflection prevention film (6a); a negative electrode (9a) and a positive electrode (9b). A cylindrical semiconductor element can be used in place of the semiconductor element (1).

25 Claims, 13 Drawing Sheets

LIGHT-EMITTING OR LIGHT-RECEIVING SEMICONDUCTOR DEVICE AND METHOD FOR FABRICATING THE SAME

This application is a national phase application under 35 U.S.C. §371 of International Application No. PCT/JP00/07359, filed Oct. 20, 2000, which was published May 2, 2002 as International Application No. WO 02/35612.

BACKGROUND OF THE INVENTION

The present invention relates to a method for making light-emitting or light-receiving semiconductor device wherein a pn junction and a pair of electrodes are formed on a spherical or cylindrical semiconductor with a pair of flat surfaces. These light-emitting or light-receiving semiconductor devices can be used in various applications such as in solar batteries, light-emitting devices, and optical semiconductor media.

Research has been done in technologies wherein a pn junction separated by a diffusion layer is formed on the surface of a small, spherical semiconductor element formed from p-type or n-type semiconductors. Multiple spherical semiconductor elements of this type are connected in parallel to a shared electrode to be used in solar cells and optical semiconductor photocatalyist.

U.S. Pat. No. 3,998,659 discloses an example of a solar cell. A p-type diffusion layer is formed on the surface of an n-type spherical semiconductor, and multiple spherical semiconductors of this type are connected to a shared electrode film (positive electrode) while the n-type cores of these spherical semiconductors are connected to a shared electrode film (negative electrode).

In U.S. Pat. No. 4,021,323, p-type spherical semiconductor elements and n-type spherical semiconductor elements are arranged in a matrix and connected to a shared electrode film. These semiconductor elements are also placed in contact with an electrolytic fluid. This results in a solar energy converter where electrolysis of the electrolyte takes place when illuminated with sunlight. U.S. Pat. Nos. 4,100,051 and 4,136,436 present similar solar energy converters.

As presented in PCT gazettes WO98/15983 and WO99/10935, the inventor of the present invention proposed a light-emitting or light-receiving semiconductor element wherein a diffusion layer, a pn junction, and a pair of electrodes are formed on a spherical semiconductor made from a p-type semiconductor and a n-type semiconductor. These multiple semiconductor elements of this type can be connected in series, and these series can be connected in parallel to form solar cells, photocatlyst devices involving the electrolysis of water and the like, as well as various types of light-emitting devices, color displays, and the like.

The semiconductor elements used in this semiconductor device are small particles with diameters of 1–2 mm. The pair of electrodes are formed at two apexes positioned on either side of the center of the spherical semiconductor element. However, the various issues remained with regard to the manufacture of the semiconductor element disclosed in these PCT gazettes.

In forming the pair of electrodes (positive and negative electrodes) on the spherical semiconductor device, the positions at which to form the electrodes are difficult to determine. Also, the spherical semiconductor devices tend to roll around, making handling difficult. This makes arranging multiple semiconductor devices difficult.

Also, once the pair of electrodes is formed, it is not possible to identify which electrode is the positive electrode and which electrode is the negative electrode. Thus, identification of the positive and negative electrodes is difficult when multiple semiconductor elements are arranged to connect them in series. Identifying the electrodes requires experience, leading to reduced efficiency. Errors in positive and negative electrode identification will lead to defective products.

OBJECTS AND SUMMARY OF THE INVENTION

The object of the present invention is to provide a spherical light-emitting or light-receiving semiconductor device that is formed with a pair of flat surfaces and that does not roll around easily. Another object of the present invention is to provide a spherical or cylindrical light-emitting or light-receiving semiconductor device in which a pair of electrodes is formed on a pair of parallel flat surfaces. Yet another object of the present invention is to provide a spherical or cylindrical light-emitting or light-receiving semiconductor device with an identifiable pair of electrodes. Yet another object of the present invention is to provide a method for making the light-emitting or light-receiving semiconductor devices described above.

A light-emitting or light-receiving semiconductor device according to the present invention includes: a roughly spherical semiconductor element formed from a p-type or n-type semiconductor, the semiconductor element being formed with parallel first and second flat surfaces at ends on either side of a center thereof; a roughly spherical pn junction formed on a surface section of the semiconductor element including the first flat surface; and first and second electrodes disposed on the first and the second flat surfaces respectively and connected to ends of the pn junction (claim 1).

It would be desirable an average diameter of the first and the second flat surfaces to be smaller than a distance between the flat surfaces (claim 2). It would be desirable for the first and the second flat surfaces to be formed with different diameters (claim 3). It would be desirable for the semiconductor element to be made from a spherical semiconductor element (claim 4).

According to another aspect, the present invention provides a light-emitting or light-receiving semiconductor device including: a cylindrical semiconductor element formed from a p-type or n-type semiconductor, the semiconductor element being formed with parallel first and second flat surfaces at ends of the element and perpendicular to an axis thereof; a pn junction formed a surface section of the semiconductor element including the first flat surface; and first and second electrodes disposed on the first and the second flat surfaces respectively and connected to ends of the pn junction (claim 5).

It would be desirable for an average diameter of the first and the second flat surfaces to be smaller than a distance between the flat surfaces (claim 6).

In the semiconductor devices in claim 2 or claim 6, the following configurations would be desirable. The semiconductor element is a single crystal semiconductor (claim 7). The semiconductor element is a silicon semiconductor (claim 8). The semiconductor element is a mixed-crystal silicon and germanium semiconductor (claim 9). The semiconductor element is a compound semiconductor formed from GaAs, InP, GaP, GaN, or InCuSe (claim 10). The semiconductor element is formed from a p-type semiconductor; the diffusion layer is formed from a n-type diffusion layer; a p-type diffusion layer is formed on the second flat surface; and a second electrode is disposed on a surface of the p-type diffusion layer (claim 11). The semiconductor element is formed from a n-type semiconductor; the diffusion layer is formed from a p-type diffusion layer; a n-type diffusion layer is formed on the second flat surface; and a second electrode is disposed on a surface of the n-type diffusion layer (claim 12).

A method for making a light emitting or light-receiving semiconductor device according to the present invention includes: a first step for making a spherical semiconductor formed from a p-type or n-type semiconductor; a second step for forming a first flat surface at an end of the semiconductor element; a third step for forming on a surface section of the semiconductor element including the first flat surface a diffusion layer from a conductor different from the semiconductor element and a roughly spherical pn junction with the diffusion layer; a fourth step for forming a second flat surface by removing the diffusion layer, the flat surface being parallel to the first flat surface and positioned opposite from the first flat surface of the semiconductor element; and a fifth step for forming a first and a second electrode on the first and the second flat surface respectively, the first and the second electrodes being connected to ends of the pn junction (claim 13).

A method for making a light emitting or light-receiving semiconductor device according to the present invention includes: a first step for making a spherical semiconductor formed from a p-type semiconductor; a second step for forming parallel first and second flat surfaces on either end of a center of the semiconductor element; a third step for forming on a surface section of the semiconductor element including the first flat surface and the second flat surface a n-type diffusion layer and a roughly spherical pn junction on the diffusion layer; and a fourth step for forming a first and a second electrode on the first and the second flat surface respectively, the first and the second electrodes being connected to ends of the pn junction (claim 14).

It would be desirable in the fourth step, for a small piece of Al, AuGa, or AuB to be placed in contact with the second flat surface and heated and fused to form a p-type recrystallized layer passing through the diffusion layer and a second electrode continuous with the recrystallized layer (claim 15).

A method for making a light emitting or light-receiving semiconductor device including: a first step for making a cylindrical semiconductor formed from a p-type or n-type semiconductor and forming parallel first and second flat surfaces at ends of the semiconductor element, the surfaces being perpendicular to an axis thereof; a second step for forming on a surface section of the semiconductor element a diffusion layer from a conductor different from the semiconductor element and a pn junction with the diffusion layer; and a third step for forming a first and a second electrode on the first and the second flat surface respectively, the first and the second electrodes being connected to ends of the pn junction (claim 16). It would be desirable in the third step, for a small piece of Al, AuGa, or AuB to be placed in contact with the second flat surface and heated and fused to form a p-type or n-type recrystallized layer passing through the diffusion layer and a second electrode continuous with the recrystallized layer (claim 17).

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a cross-section drawing of a spherical semiconductor element.

FIG. 2 is a cross-section drawing of the semiconductor element formed with a first flat surface.

FIG. 3 is a cross-section drawing of a semiconductor element formed with a diffusion layer and a pn junction.

FIG. 4 is a cross-section drawing of a semiconductor element formed with a second flat surface.

FIG. 5 is a cross-section drawing of a semiconductor element formed with a diffusion layer.

FIG. 6 is a cross-section drawing of a semiconductor device.

FIG. 7 is a plan drawing of a lead frame plate.

FIG. 8 is a cross-section drawing of an assembly in which semiconductor devices have been assembled with a lead frame plate.

FIG. 9 is a cross-section detail drawing of a semiconductor device and a lead frame.

FIG. 10 is a plan drawing of three sets of semiconductor modules and lead frame plates.

FIG. 11 is a cross-section drawing of a semiconductor module and lead frame plate.

FIG. 12 is a cross-section drawing of a semiconductor module and lead frame plate.

FIG. 13 is a plan drawing of a semiconductor module.

FIG. 14 is a cross-section drawing of a semiconductor module.

FIG. 15 is a side-view drawing of a semiconductor module.

FIG. 16 is an equivalent circuit diagram of a semiconductor module.

FIG. 18 is a cross-section drawing of a semiconductor element formed with first and second flat surfaces.

FIG. 19 is a cross-section drawing of a semiconductor element formed with a diffusion layer.

FIG. 20 is a cross-section drawing of a semiconductor element formed with a negative electrode.

FIG. 21 is a cross-section drawing of a semiconductor device.

FIG. 22 is a drawing showing a cylindrical semiconductor material and a semiconductor element.

FIG. 23 is a cross-section drawing along the XXIII—XXIII line from FIG. 22.

FIG. 24 is a cross-section drawing of a semiconductor element formed with a diffusion layer FIG. 25 is a cross-section drawing of a semiconductor element with a flat surface removed.

FIG. 26 is a cross-section drawing of a semiconductor element formed with a diffusion layer.

FIG. 27 is a cross-section drawing of a semiconductor device.

FIG. 28 is a plan drawing of a semiconductor module.

FIG. 29 is a cross-section drawing along the XXVIIII—XXVIIII line from FIG. 28.

FIG. 30 is a simplified cross-section detail drawing of a semiconductor device and lead frame.

FIG. 31 is a plan drawing of an assembly during the process of making a semiconductor module.

FIG. 32 is a front-view drawing of an assembly.

FIG. 33 is a plan drawing of a semiconductor module.

FIG. 34 is a cross-section drawing of a semiconductor module.

DETAILED DESCRIPTION OF THE PREFERRED EMBODIMENTS

Referring to the figures, the embodiments of the present invention will be described.

First, the structure of a semiconductor device according to the present invention will be described.

Figure 4:
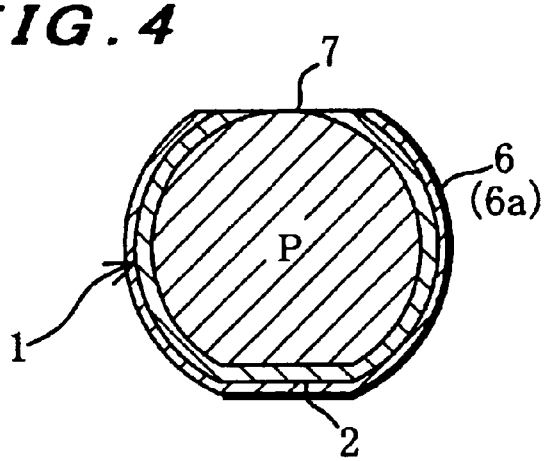
Figure 5:
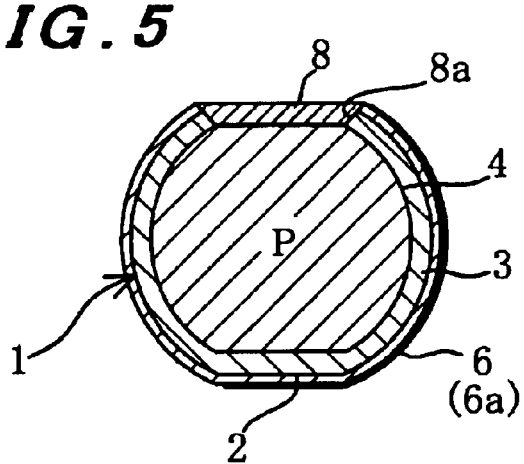
Figure 6:
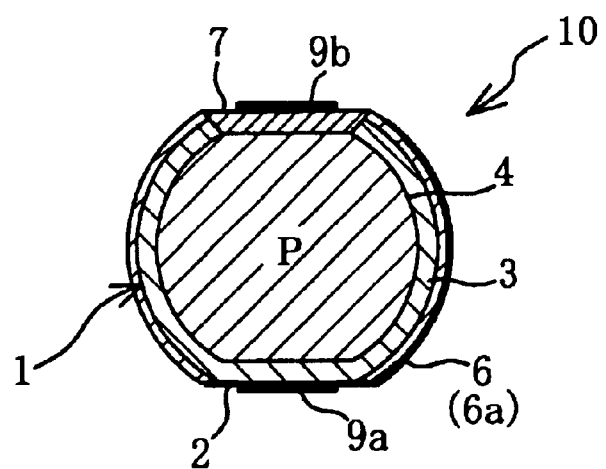

Referring to FIG. 1 through FIG. 6, there is shown a method for making a light-receiving semiconductor device 10 suited for solar cells. Referring to FIG. 6, there is shown a cross-section drawing of the light-receiving semiconductor device 10.

Referring to FIG. 6, the light-receiving semiconductor device 10 is formed from: a semiconductor element 1 formed, for example, from a p-type semiconductor; an n-type diffusion layer 3; a pn junction 4; a pair of electrodes 9a, 9b (a negative electrode 9a, a positive electrode 9b); a diffusion layer 8 formed from a type-p+ semiconductor; and a reflection prevention film 6a. The semiconductor element 1 is formed from a perfectly spherical semiconductor element 1a (see FIG. 1) formed from a p-type silicon single crystal with a diameter of, for example, 1.5 mm. At a pair of apexes on either side of the center of the semiconductor element 1 are formed first and second flat surfaces 2, 7, which are parallel to each other. The first flat surface 2 has a diameter of, for example, 0.6 mm. The second flat surface 7 has a diameter of, for example, 0.8 mm. The average diameter of the first flat surface 2 and the second flat surface 7 is smaller than the distance between the first flat surface 2 and the second flat surface 7.

The diffusion layer 3 is formed on a section of the surface of the semiconductor element 1 that includes the first flat surface 2. A n-type diffusion layer 3 is not formed on the second flat surface 7, and instead a type-p+ diffusion layer 8 is formed. The diffusion layer 3 is a type n+diffusion layer formed through phosphorous diffusion and having a thickness of 0.4–0.5 microns. The pn junction 4 (more precisely, a pn+ junction) is formed roughly spherically, with the diffusion layer 3.

On the first flat surface 2, the negative electrode 9a is formed as a thin film on the surface of the diffusion layer 3 by baking a silver paste. On the second flat surface 7, the positive electrode 9b is formed as a thin film on the surface of the type p+ diffusion layer 8 by baking a silver paste. The reflection prevention film 6a is formed from a silicon oxide film 6 and is formed over the surface of the diffusion layer 3 with the exception of the first flat surface 2 and the second flat surface 7. The structure of the light-receiving semiconductor device 10 will become further evident in the description of the method for making the light-receiving semiconductor device 10 provided below.

In this light-receiving semiconductor device 10, the roughly spherical pn junction 4 has an photo-electrical conversion function and photo-electrically converts received sunlight to generate ab electric power of approximately 0.6 volts. The first flat surface 2 and the second flat surface 7 prevents the light-receiving semiconductor device 10 from easily rolling around while allowing it to be easily grasped from both sides, thus making handling easier. Furthermore, since the first flat surface 2 and the second flat surface 7 have different sizes, the negative electrode 9a and the positive electrode 9b can be easily distinguished either visually or through a sensor. This makes assembly of the light-receiving semiconductor device 10 into semiconductor modules more efficient.

Figure 1:
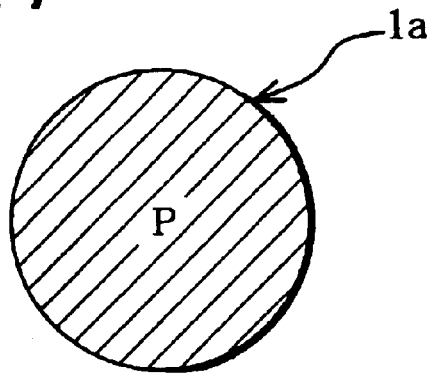
FIG. 1 through FIG. 16 are drawings showing the first embodiment.

Referring to FIG. 1 through FIG. 6, a method for making the light-receiving semiconductor device 10 presented above will be described. Referring to FIG. 1, a spherical semiconductor element 1a is produced as a true sphere formed from a p-type silicon of single crystal with a resistivity of approximately 1 ohm-meter. This type of spherical semiconductor element 1a can be made using methods proposed in Japanese laid-open patent publication number 10-33969 and International gazette WO98/15983. In this method, a silicon particle is melted inside the upper end of a drop tube. The silicon particle is dropped down and solidifies while free falling to form a spherical shape due to surface tension, thus forming a spherical silicon single crystal. It would also be possible to form spherical semiconductors by performing mechanical polishing or the like.

Figure 2:
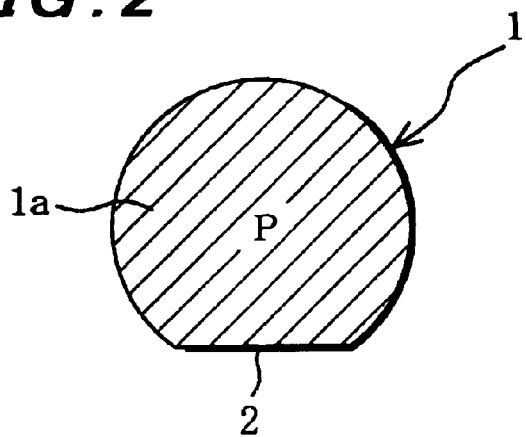
Figure 3:
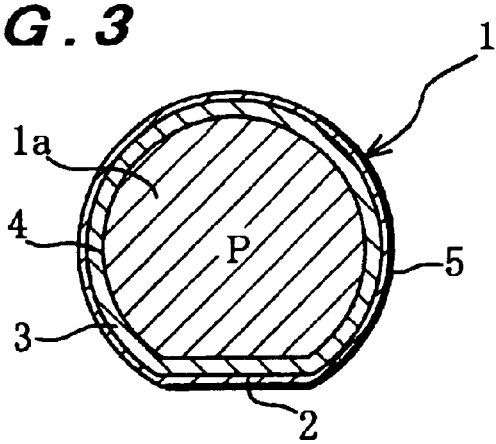

Referring to FIG. 2, mechanical and chemical grinding is performed on a section of the surface of the spherical semiconductor element 1a to form the first flat surface 2 having a diameter of approximately 0.6 mm. Referring to FIG. 3, a method known in the art is used to diffuse phosphorous over the entire surface to form an n+ diffusion layer 3, resulting in a roughly spherical pn junction 4 positioned at a depth of about 0.4–0.5 microns from the surface of the spherical semiconductor element 1. A silicon oxide film 5 formed on the surface during the phosphorous diffusion process is removed through etching, and heat is applied again under an oxygen atmosphere to form a silicon oxide film 6 (reflection prevention film 6a).

Referring to FIG. 4, the side opposite from the first flat surface 2 is processed through mechanical and chemical grinding to form the second flat surface 7, where the p-type silicon single crystal is exposed with a diameter of approximately 0.8 mm. The first and the second flat surfaces 2, 7 are formed parallel at end points on either side of the center of the sphere. The diameter of the second flat surface 7 is formed different from the diameter of the first flat surface 2, allowing easy identification of the negative electrode 9a and the positive electrode 9b when connecting lead frames, as described later.

Referring to FIG. 5, using a method known in the field, after forming the first and the second flat surfaces 2, 7 and masking by the silicon oxide film 6, the boron is diffused over the surface of the p-type silicon single crystal exposed at the second flat surface 7 to form a type-p+ diffusion layer 8 having a thickness of 0.2–0.3 microns. The boron is diffused over the p-type layer on the second flat surface 7, and a p+n+ junction 8a that is in contact with the type-n+ diffusion layer 3 at the edges of the second flat surface 7 is formed inside the silicon oxide film 6. The surface of the p+n+ junction 8a is protected by the silicon oxide film 6.

Referring to FIG. 6, a silver paste is applied to the surface of the diffusion layer 3 on the first flat surface 2 and the surface of the diffusion layer 8 on the second flat surface 7. The silver paste layers are heated and baked at a range of 600–800 deg C. under an oxidizing atmosphere. This results in the negative electrode 9a and the positive electrode 9b, which form low-resistance connections with the diffusion layer 3 and the type-p+ diffusion layer 8 respectively. This completes a spherical light-receiving semiconductor device 10 suited for solar cells.

The production method described above is just one example. The processes for forming the type-n+ diffusion layer 3, etching, forming the electrodes, and forming the reflection prevention film can be selected from conventional technologies. Also, the materials used are not restricted to those described above, and other materials that have been used conventionally in the past can be used. Also, apart from the silicon oxide film described above, the reflection-prevention film can also be a known reflection-prevention film such as a titanium oxide film.

Next will be described a structure of and method for making an inexpensive resin mold light-receiving semiconductor module 20 suited for mass production and that uses the light-receiving semiconductor device 10 made as a solar cell as described above. Referring to FIG. 13 through FIG. 16, the structure will be described first. The light-receiving semiconductor module 20 can, for example, include: twenty-five light-receiving semiconductor devices 10; a conductive connector mechanism formed from six lead frames 29 and serving to electrically connect these twenty-five light-receiving semiconductor devices 10; a light transmitting member 31; a positive electrode terminal 33; and a negative electrode terminal 34.

The twenty-five spherical light-receiving semiconductor devices 10 are arranged in multiple rows and multiple columns with their conductivity directions aligned (in this embodiment five rows and five columns). By the conductive connector mechanism, the semiconductor devices 10 in each column are connected electrically in series, and the semiconductor devices 10 in each row are connected electrically in parallel. The conductive connector mechanism is formed from six metallic lead frames 29. A lead frame 29 is mounted between adjacent rows of semiconductor devices 10 and forms electrical connections with the electrodes 9a, 9b. The lead frame 29 that is integral with the negative electrode terminals 34 at the bottom end is electrically connected in parallel with the electrodes 9a of the semiconductors 10 of the first row. The lead frame 29 that is integral with the positive electrode terminals 33 at the top end is electrically connected in parallel with the electrodes 9b of the semiconductor devices 10 of the fifth row. These twenty-five semiconductor devices 10 and the conductive connector mechanism can be, for example, embedded in a light-transmitting member 31 and covered.

The light-transmitting member 31 is formed from a transparent synthetic resin such as an acrylic resin or polycarbonate. The light-transmitting member 31 is formed with semi-cylindrical lenses 31a for introducing sun light from either side of semiconductor devices 10. These semi-cylindrical lenses 31a serve to efficiently introduce sun light to the columns of the semiconductor devices 10. Compared to a flat structure, a wider orientation brings superior light collection, light focusing, and light guiding properties.

Figure 16:
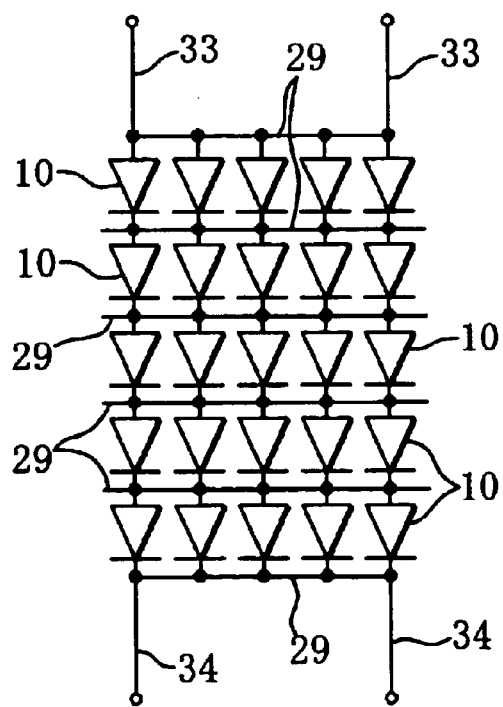

Referring to FIG. 16, there is shown an electrical circuit that is equivalent to the light-receiving semiconductor module 20 used in a solar cell panel as described above. The twenty-five semiconductor devices 10 form a five-by-five matrix, and the rows of semiconductor devices 10 is connected electrically in series by the six lead frames 29. The rows of semiconductor devices 10 are connected electrically in parallel by the lead frames 29.

If one of the semiconductor devices 10 in this semiconductor module 20 malfunctions and stops working, light-generated power will simply stop from the malfunctioning semiconductor device 10 while the other functioning semiconductor devices 10 will continue to operate normally and generate electricity. The generated electricity is reliably output through the positive electrode terminal 33 and the negative electrode terminal 34 so that the light-receiving semiconductor module 20 will provide superior reliability and longevity.

Referring to FIG. 7 through FIG. 12, a method for making the light-receiving semiconductor module 20 (solar cell module) presented above will be described.

Figure 7:
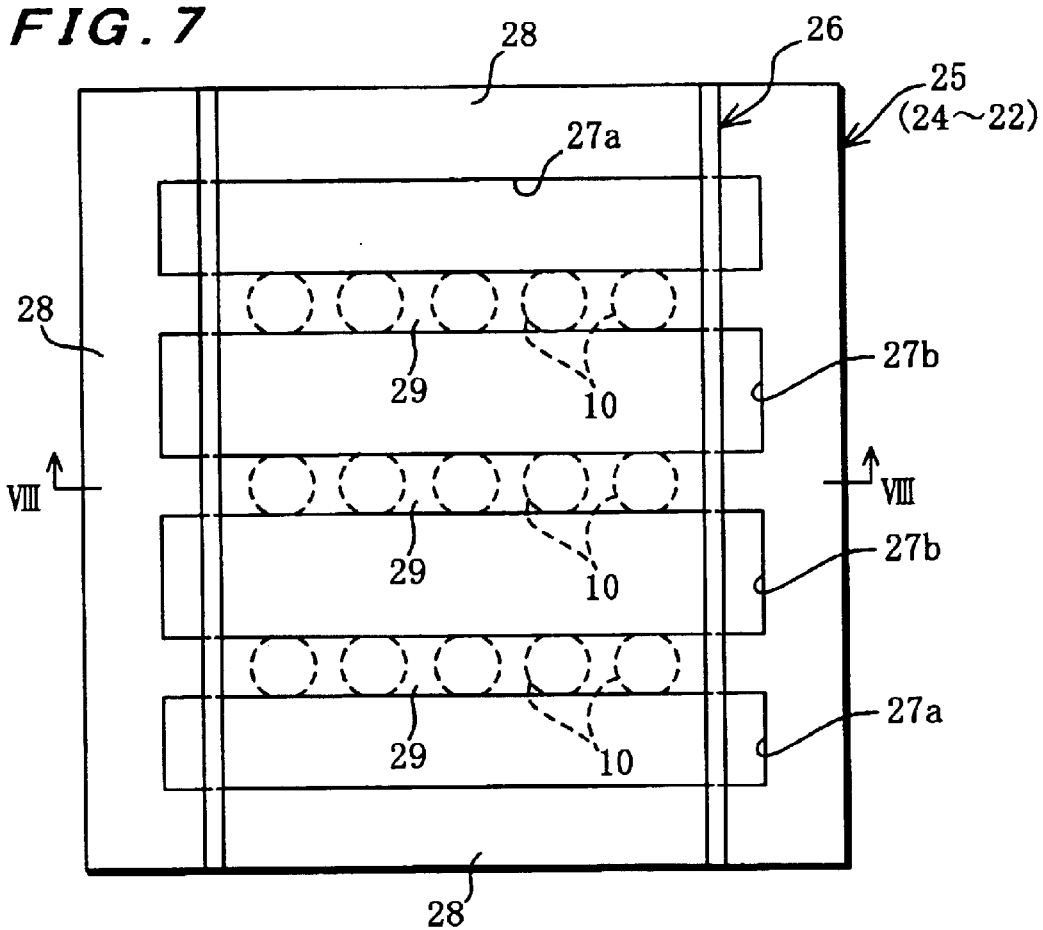

First, the semiconductor devices 10 described above are made. Referring to FIG. 7, lead frame plates 21–26 formed with four openings 27a, 27b are made by using a die to punch thin iron-nickel alloy (56% Fe, 42% Ni) plates (thickness of approximately 0.3 mm) with silver surface plating approximately 3 microns thick. Wide (approximately 4 mm) outer frames 28 and three parallel narrow (1.5 mm) lead frames 29 are formed on the lead frame plates 21–26. The ends of the top and bottom lead frame plates 21, 26 are bent beforehand at right angles, and the inner four lead frame plates 22–25 are formed as flat sheets.

Figure 8:
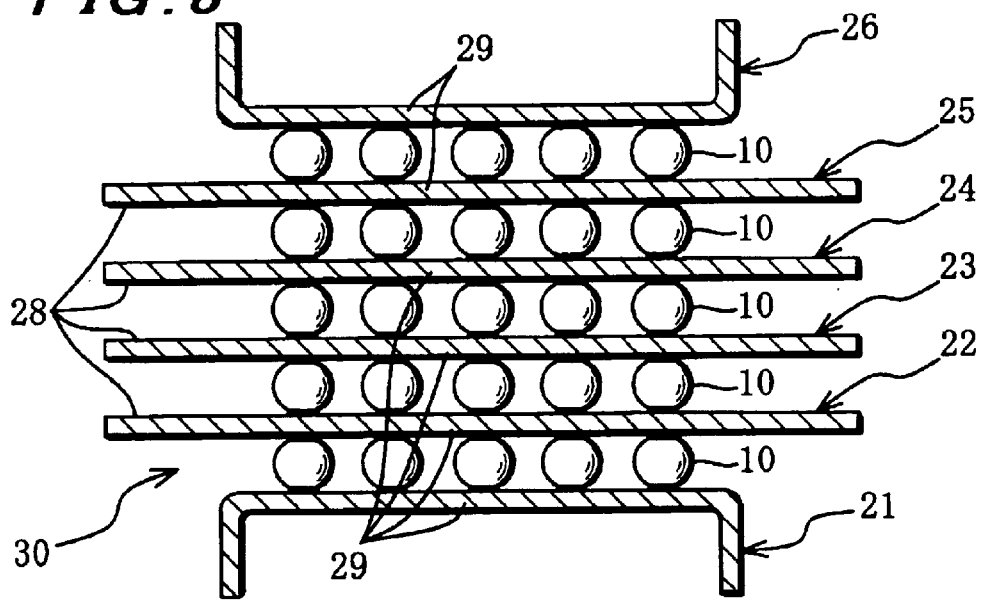
Figure 9:
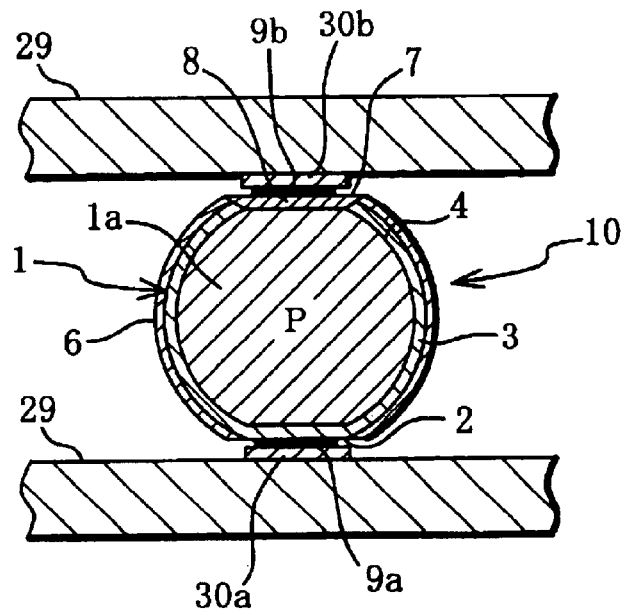

Referring to FIG. 7 through FIG. 9, a conductive adhesive 30a (e.g., a silver epoxy resin) is used on the lead frames 29 of the lead frame plates 21–25 so that sets of five semiconductor devices 10 can be adhesed at an even pitch with their negative electrode 9a facing down.

Next, a conductive adhesive 30b is applied on the positive electrodes 9b of the semiconductor devices 10 on the lead frames 29. Referring to FIG. 8, the lead frame 29 of the lead frame plate 22 is placed on top of the positive electrodes 9b of the fifteen (three sets of five) semiconductor devices 10 on the bottom layer. The lead frame plates 23–26 are subsequently stacked in sequence in a similar manner, thus forming a regularly arranged five-by-five matrix with each set of twenty-five semiconductor devices 10 being aligned with the other sets. Next, in order to provide electrical connections for the positive electrode 9b and the negative electrode 9a of each of the semiconductor devices 10 to the lead frames 29 above and below it, a weight (not shown in the figure) having a predetermined weight is placed on the uppermost lead frame plate 26 and heat of approximately 160–180 deg C. is applied to set the adhesive.

In this manner, the sets (modules) of twenty-five semiconductor devices 10 are electrically connected by the six lead frame plates 21–26, and three sets with a total of 75 semiconductor devices 10 are arranged in a regular manner between the lead frames 29 of the six lead frame plates 21–26. Within the sets of 25 semiconductor devices 10, the semiconductor devices 10 in each column are connected electrically in series by the lead frames 29, and the semiconductor devices 10 in each row are electrically connected in parallel. Referring to FIG. 9, there is shown a detail drawing of a semiconductor device 10 and the lead frames 29 above and below it.

Figure 10:
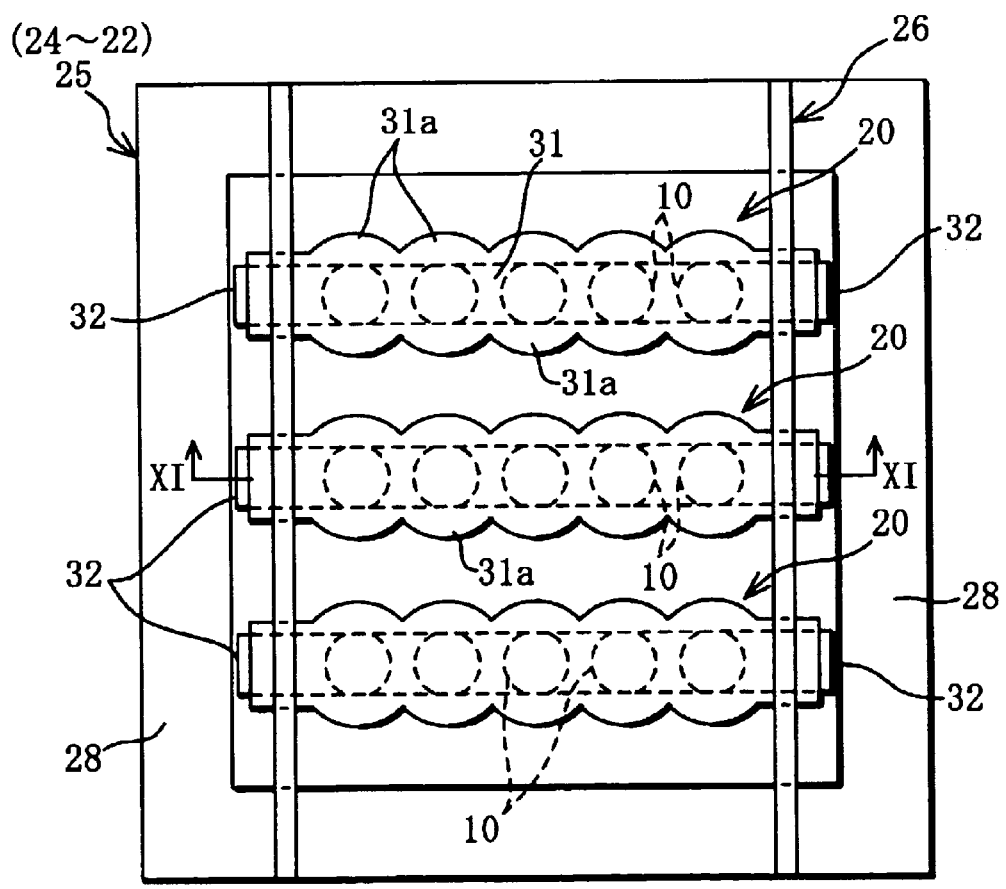
Figure 11:
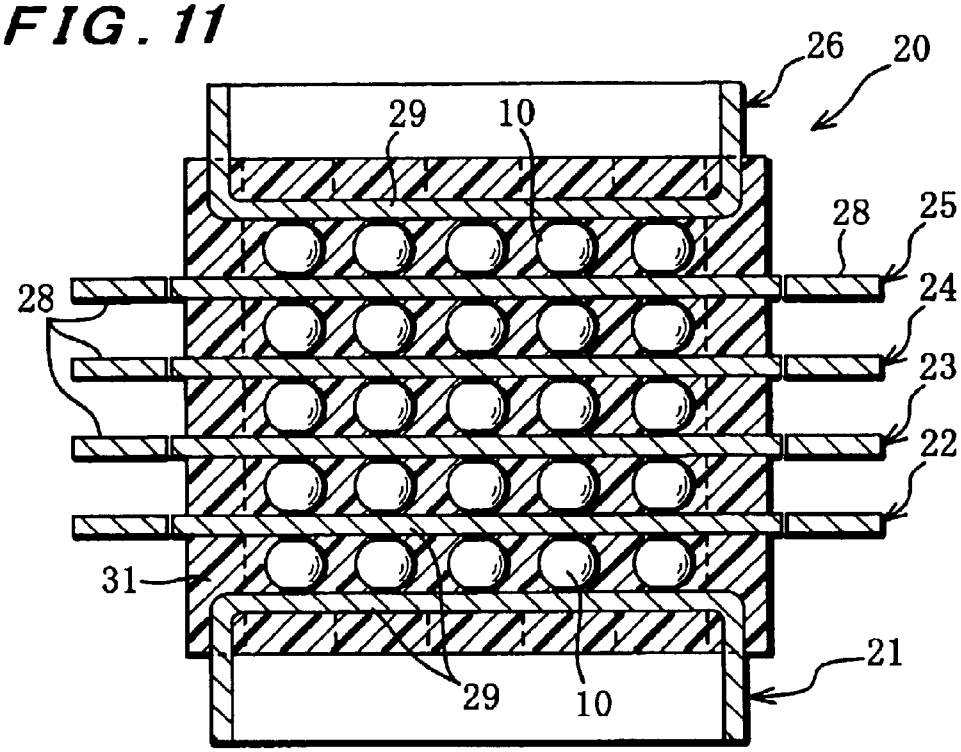
Figure 12:
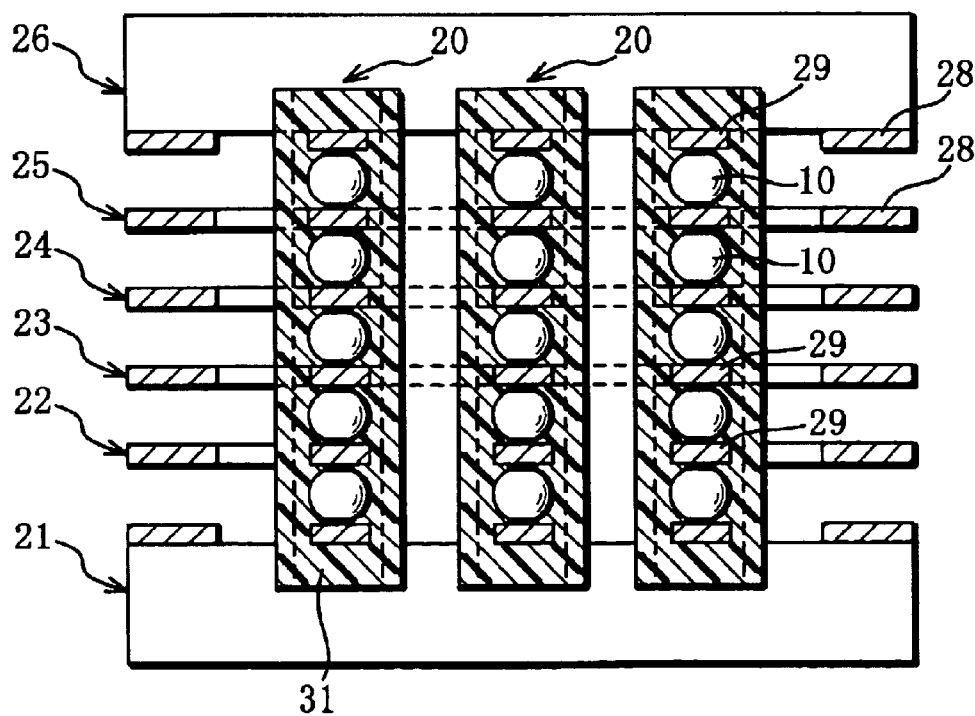
Figure 13:
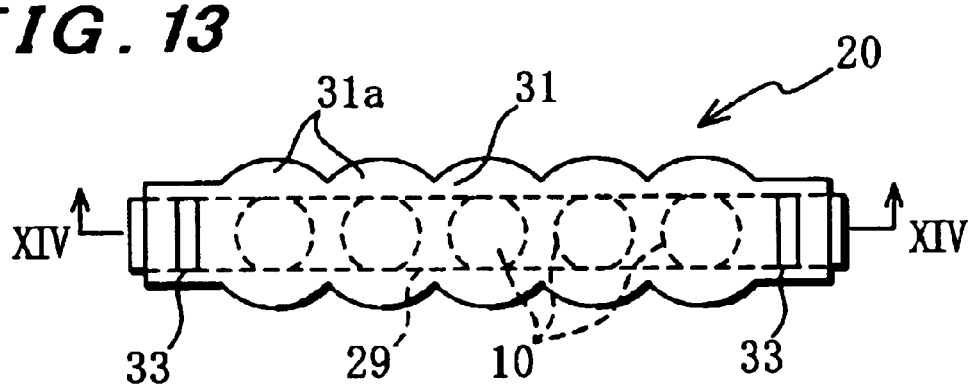
Figure 14:
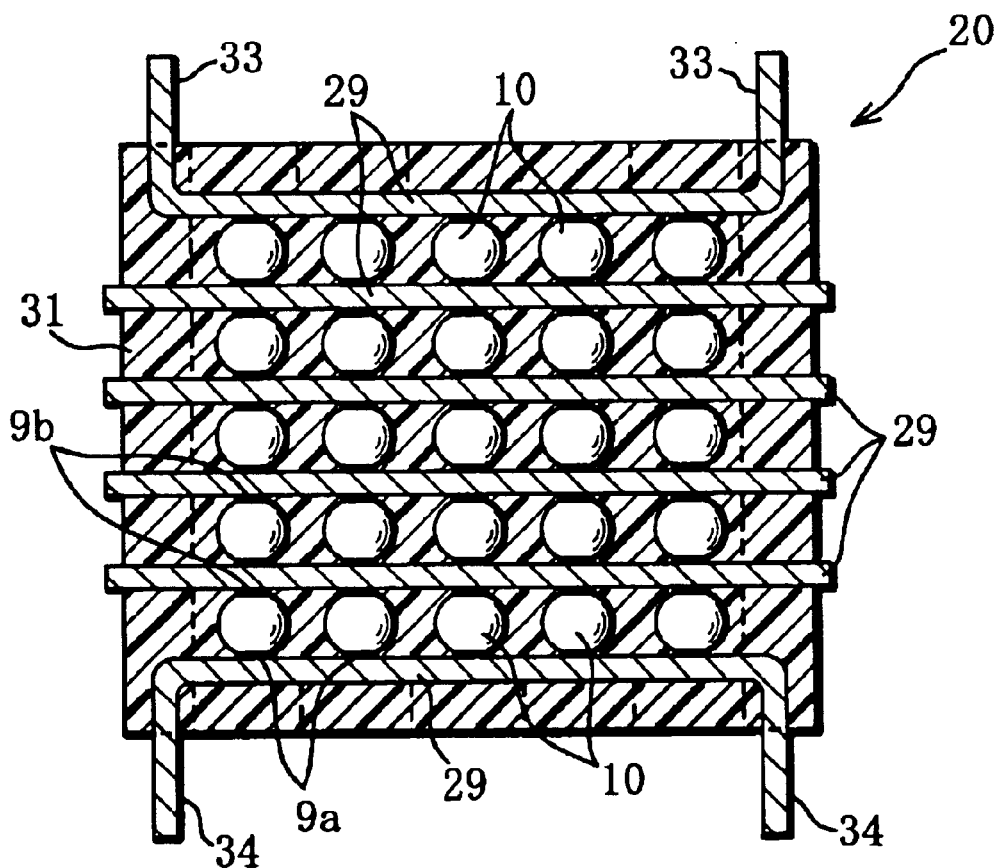
Figure 15:
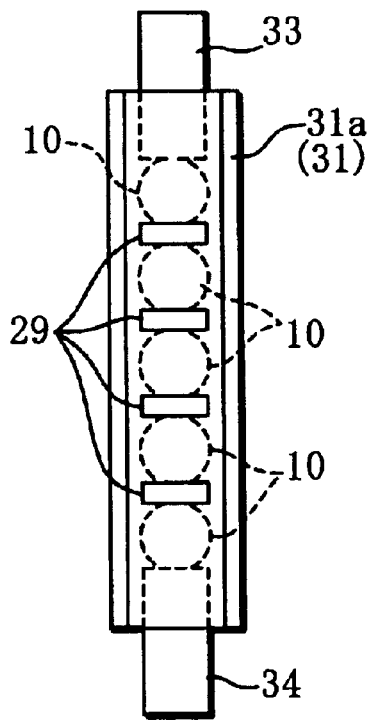

Referring to FIG. 10 through FIG. 12, an assembly 30 formed from the 75 semiconductor devices 10 and the six lead frame plates 21–26 is housed in a molding die (not shown in the figure) and a transparent synthetic resin (e.g., an acrylic resin or a polycarbonate) is used to form a mold. This results in the five-by-five matrices of semiconductor devices 10 and their corresponding lead frames 29 being embedded in and covered by the light-transmitting members formed from the transparent synthetic resin as described above. In this manner, three sets of solar panels, i.e., light-receiving semiconductor modules 20, are formed at once. The light-transmitting members 31 are formed with partially cylindrical lenses 31a that focus sun light from either side of the rows of the semiconductor devices 10.

Finally, the three sets of light-receiving semiconductor modules 20 are separated. First, for the middle lead frame plates 22–25, cutting areas 32 at the ends of the lead frames 29 extending from the light-transmitting members 31 are cut by the molding die. For the top and bottom lead frame plates 21, 26, the cutting areas of the lead frames 29 are cut from the outer frame 28 leaving them to extend out from the light-transmitting member 31.

Next, different alternatives involving partial modifications to the above embodiment will be presented.

Figure 17:
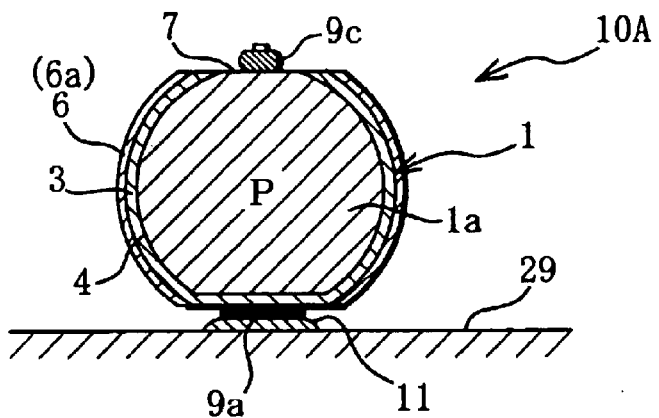
FIG. 17 is a cross-section drawing of a semiconductor device according to an alternative embodiment 1.

1) Alternative Embodiment 1 (FIG. 17)

Referring to FIG. 17, a semiconductor device 10A is formed with a positive electrode 9c, in which an aluminum ball is bonded to the second flat surface 7. The type-p+ diffusion layer 8 described above is omitted. To produce this semiconductor device 10, the steps illustrated in FIG. 1 through FIG. 4 are performed. Then, with the negative electrode 9a bonded to the lead frame 29 with solder 11, an aluminum ball having a diameter of 0.3–0.4 mm is bonded to the center of the second flat surface 7 via ultrasound and heat, thus forming the positive electrode 9c, in the form of a bump.

It would also be possible to use a gold ball in place of the aluminum ball described above. Electrodes formed via ball bonding in this manner are suited for accurate electrode formation in a small space and low-resistance contacts can be formed at lower temperatures compared with using diffusion or alloys.

Since the height of the positive electrode 9c can be increased, it is possible to increase the space between the lead frames 29 or the space between the semiconductor device electrodes when semiconductor devices are connected in series. Thus, a conductive adhesive can be applied to just the positive electrode 9c. Also, this positive electrode 9c can be implemented for the semiconductor device 10 described above. Also, the semiconductor device 10A described here can be used in the semiconductor module 20 in place of the semiconductor device 10.

2) Alternative Embodiment 2 (FIG. 18–FIG. 21)

Figure 18:
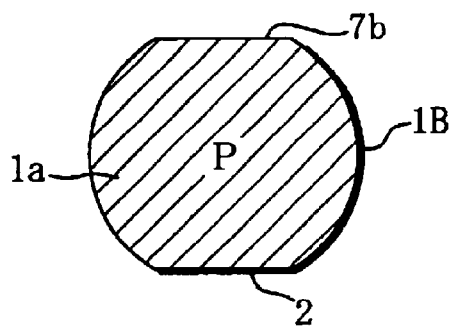
FIG. 18 through FIG. 21 are drawings showing an alternative embodiment 2.
Figure 19:
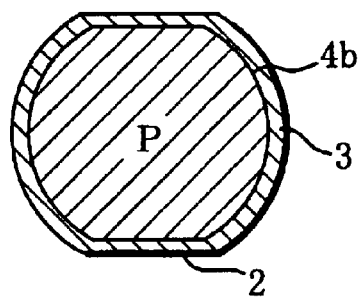

Referring to FIG. 18 through FIG. 21, a method for making a semiconductor device 10B will be described. Referring to FIG. 18, a semiconductor element 1B is formed as in the embodiment described above. First and second flat surfaces 2, 7b are formed parallel to each other at the two ends on either side of the center of a spherical semiconductor element 1a (1.5 mm diameter) formed from a p-type silicon single crystal (1 ohm-m resistivity). The diameters of the first and second flat surfaces 2, 7b are approximately 0.6 mm and 0.8 mm respectively, and the average diameters of the first and second flat surfaces 2, 7b are smaller than the distance between the first and second flat surfaces 2, 7b. Referring to FIG. 19, phosphorous is dispersed as a n-type dopant over the entire surface of the semiconductor element 1B to form a type-n+ diffusion layer 3 having a thickness of approximately 0.4–0.5 microns.

Figure 20:
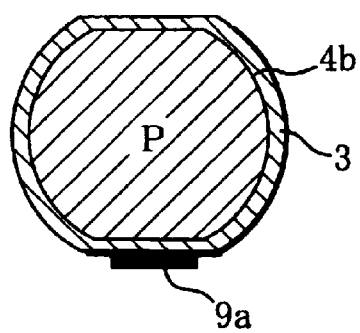
Figure 21:
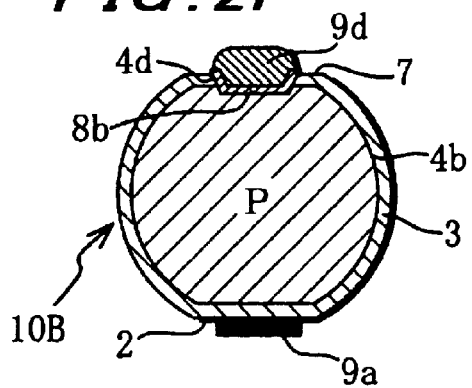

Referring to FIG. 20, the silicon oxide film generated during the diffusion of phosphorous is removed by etching. Referring to FIG. 21, a silver paste is printed on the center of the first flat surface 2 as a dot having a diameter of 0.4 mm and a thickness of 0.2 mm. This silver paste is heated under an oxidizing gas or an inert gas atmosphere at a temperature of 600–800 deg C., resulting in a negative electrode 9a that forms a low-resistance connection with the diffusion layer 3. Next, an aluminum dot having a diameter of approximately 0.4 mm and a thickness of approximately 0.3 mm is placed on the surface of the second flat surface 7b and is heated rapidly to a temperature of 750–850 deg C. under an inert gas atmosphere or in a vacuum. As a result, the silicon melted by the eutectic reaction of the aluminum and the silicon grows into a type p+ recrystallized layer 8b doped with aluminum, with the silicon single crystal serving as a seed. This is technology is known as alloy pn-junction forming.

Since the recrystallized layer 8b passes through the diffusion layer 3, the aluminum remaining on the surface forms a negative electrode 9d forming a low-resistance connection with the p-type silicon single crystal section via the type-p+ recrystallized layer 8b. The pn junction 4b is connected to the p+n+ junction 4d. An anti-reflection film (not shown in the figure) for the semiconductor element 1B is then formed.

With this semiconductor element 1B, the type-p+ recrystallized layer 8b and the positive electrode 9d can be formed at the same time without requiring boron diffusion as in the semiconductor device 10 described above. Since the height of the positive electrode 9d is increased, conductive adhesive can be applied without affecting the surface of the recrystallized layer 8b.

In place of the aluminum described above, it would also be possible to form the recrystallized layer 8b and the positive electrode 9d at the same time using gold (AuB) formed with a molecular ratio of approximately 99% gold and 1% boron. Alternatively gold (AuGa) with a ratio of 99% gold and 1% gallium could be used. Also, this semiconductor device 10B can be used in the semiconductor module 20 in place of the semiconductor device 10 described above.

Figure 26:
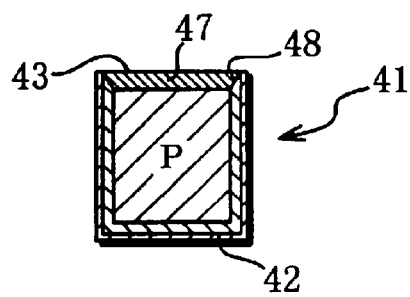
Figure 27:
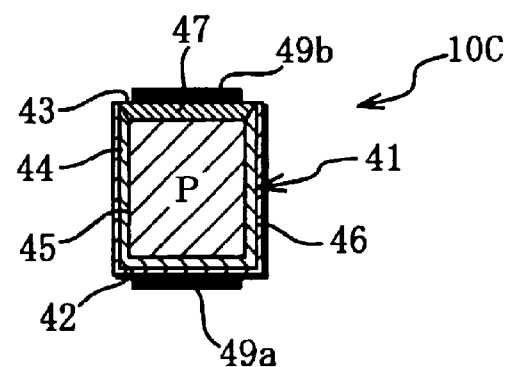

3) Alternative Embodiment 3 (FIG. 22–FIG. 30) Referring to FIG. 27, a light-receiving semiconductor device 10C suited for use in solar cells includes: a cylindrical semiconductor element 41; first and second flat surfaces 42, 43 thereof; a n-type diffusion layer 44; a pn junction 45; a type-p+ diffusion layer 47; a silicon oxide film 46 serving as a reflection prevention film; a negative electrode 49a; and a positive electrode 49b. This semiconductor device 10C is formed as a short cylinder. While having a different shape from the semiconductor device 10, the structure is similar and the following description will be simplified.

The semiconductor element 41 is formed with parallel first and second flat surfaces 42, 43 at the ends so that they are perpendicular to the axis. The diffusion layer 44 is formed on the outer perimeter surface and the first flat surface 42 of the semiconductor element 41. The pn junction 45 is formed on the surface layer of the semiconductor element 41 on top of the diffusion layer 44. The diffusion layer 44 of the second flat surface 42 is removed through mechanical/chemical polishing, and the type-p+ diffusion layer 47 is formed on the second flat surface 43.

The negative electrode 49a is formed on the surface of the diffusion layer 44 on the first flat surface 42. The positive electrode 49b is formed on the surface of the diffusion layer 47 on the second flat surface 43. The diffusion layer 44, the pn junction 45, the diffusion layer 47, the positive electrode 49a, and the negative electrode 49b are similar to those of the semiconductor device 10.

Figure 22:
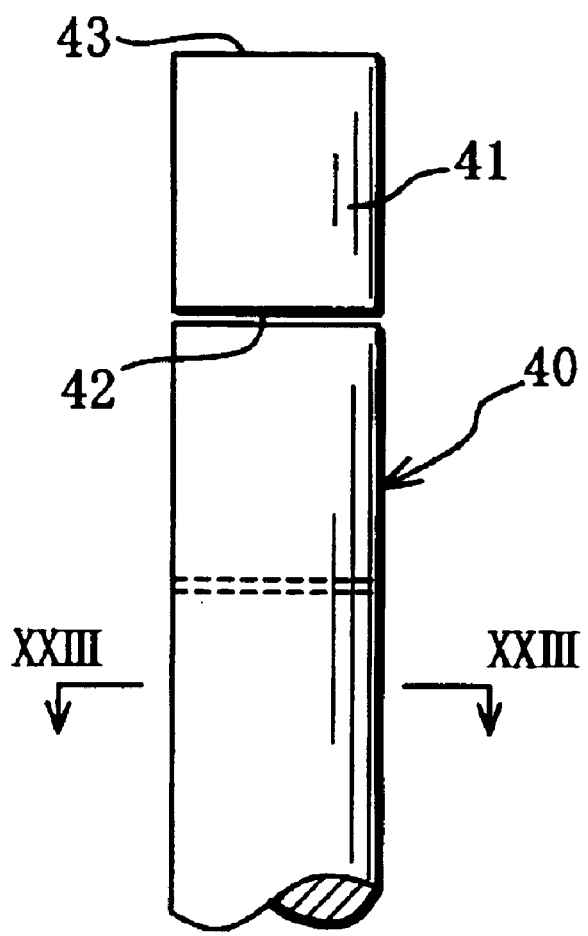
FIG. 22 through FIG. 30 show an alternative embodiment 3.
Figure 23:
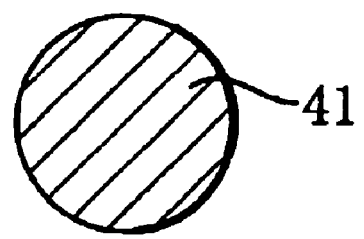

Referring to FIG. 22 through FIG. 27, a method for making the cylindrical semiconductor device 10C presented above will be described. Referring to FIG. 22 and FIG. 23, a semiconductor material 40 is formed as a thin cylinder having a diameter of 1.5 mm from a p-type silicon single crystal with a resistivity of approximately 1 ohm-meter. This cylindrical semiconductor material 40 is cut to an axial length of 1.6 mm to form a short cylindrical (i.e., particle-shaped) semiconductor element 41 having parallel first and second flat surfaces 42, 43 formed perpendicular to the axis.

This cylindrical semiconductor material formed from the p-type silicon single crystal can be made by growing a single crystal in the following manner: place a seed crystal with<111>orientation into contact with molten silicon in a crucible, e.g., a graphite crucible, through a nozzle-shaped hole at the bottom of the crucible, and pull the seed crystal down. Since this produces a thin cylindrical shape, minimal processing loss is generated, making the process economical. The diameter of the cylindrical semiconductor material 40 is not restricted to 1.5 mm, and other diameters of approximately 1–3 mm can be used.

Figure 24:
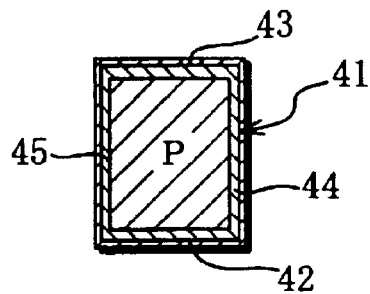

Referring to FIG. 24, phosphorous is diffused over the entire surface of the cylindrical semiconductor element 41 to form a type-n+ diffusion layer 44 having a thickness of 0.4–0.5 microns. A pn junction 45 is formed on the outer perimeter surface and the first flat surface 42 of the semiconductor element 41 by means the diffusion layer 44.

Figure 25:
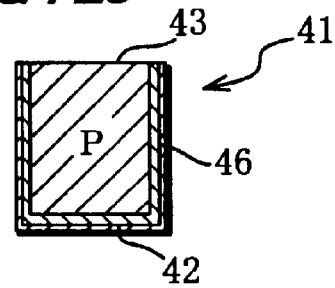

Referring to FIG. 24 and FIG. 25, the silicon oxide film formed on the surface during the phosphorous diffusion operation is removed using a hydrofluoric acid solution. Then, the semiconductor element 41 is heated under an oxygen atmosphere to form a silicon oxide film 46 (reflection prevention film) over the entire surface. Then, the second flat surface is polished via mechanical/chemical polishing to remove the type-n+ diffusion layer 44, thus forming the second flat surface 43 with the silicon single crystal exposed.

Referring to FIG. 26, boron is diffused over the second flat surface 43 after removing the silicon oxide film on the second flat surface 43. This forms the type-p+ diffusion layer 47 having a thickness of 0.1–0.2 microns. As a result, the p+n+ junction 48 is formed, and the end thereof can be positioned inside the silicon oxide film so that it is sealed from the outside.

Referring to FIG. 27, silver paste dots with a diameter of approximately 0.5 mm and a thickness of approximately 0.2 mm are printed at the center of the first and second flat surfaces 42, 43. These are then heated in the same manner as in the semiconductor device 10, and the negative electrode 49a and the positive electrode 49b are disposed to form low-resistance contact with the diffusion layer 44 and the diffusion layer 47 respectively. This provides the cylindrical semiconductor device 10C suited for use in solar cells. The negative electrode and the positive electrode in this semiconductor device 10C can also be formed using the method shown in FIG. 18 through FIG. 21.

With this semiconductor device 10C, cells are easier to manufacture compared to spherical solar cells. Although not omnidirectional, this device provides uniform orientation along the radius of the semiconductor element. The photoelectrical conversion characteristics provides superior light-collecting abilities compared to flat cells.

Figure 28:
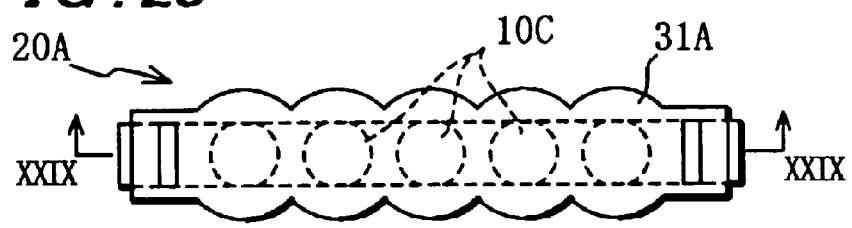
Figure 29:
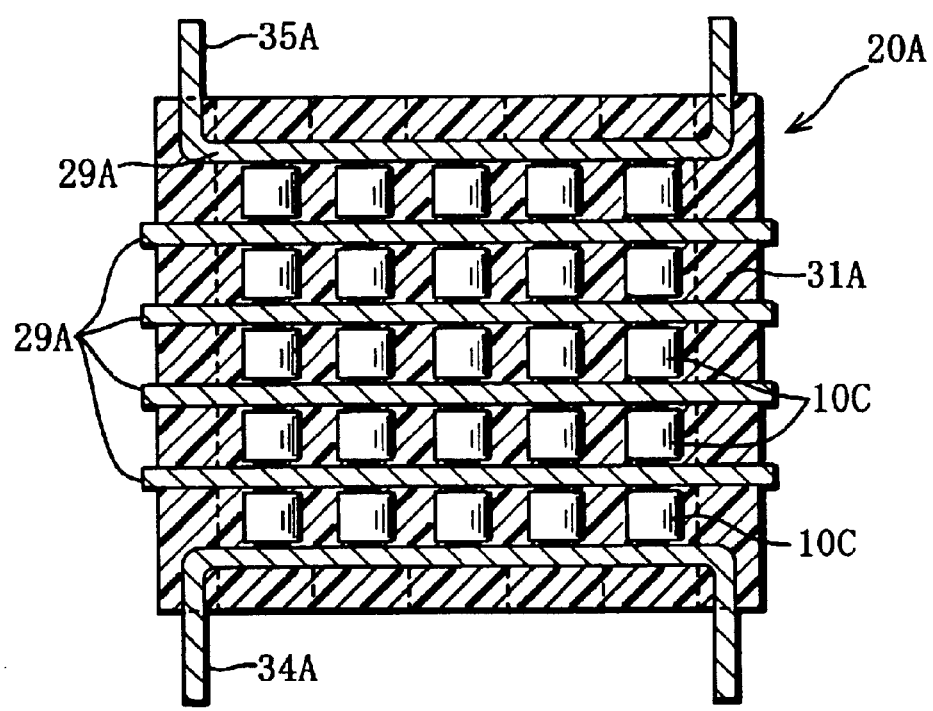
Figure 30:
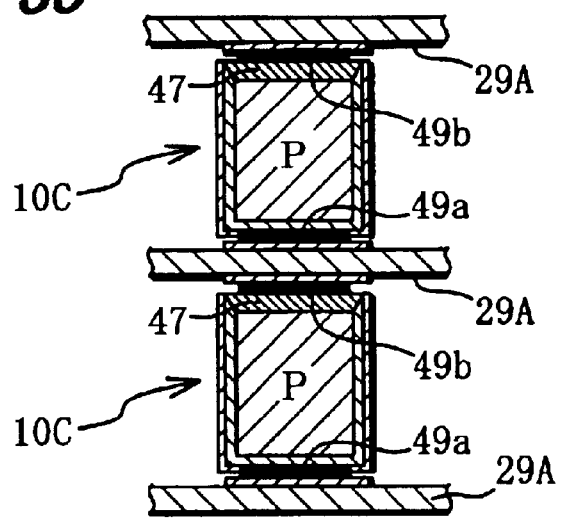

Referring to FIG. 28 through FIG. 30, this semiconductor device 10C can be used in place of the semiconductor device 10 in the semiconductor module 20 described above. This provides a semiconductor module 20A similar to that of the semiconductor module 20. In this semiconductor module 20A, the lead frame 29A, the negative electrode 34A, the positive electrode 35A, the light transmitting member 31A, and the like are similar to those of the semiconductor module 20, and hence are assigned like numerals and corresponding descriptions are omitted.

Figure 33:
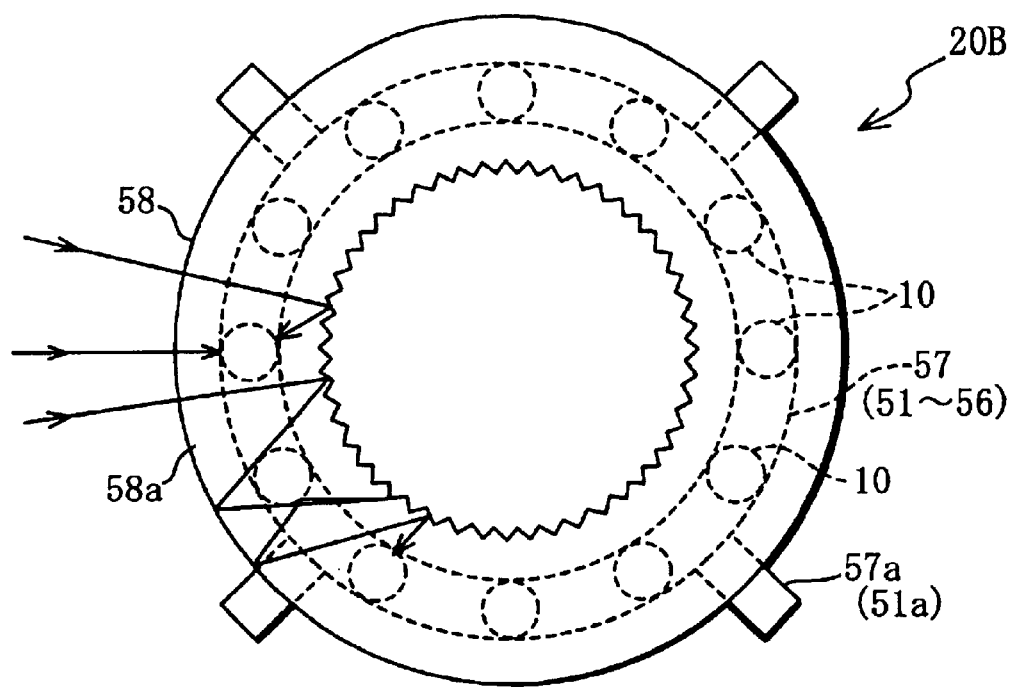
Figure 34:
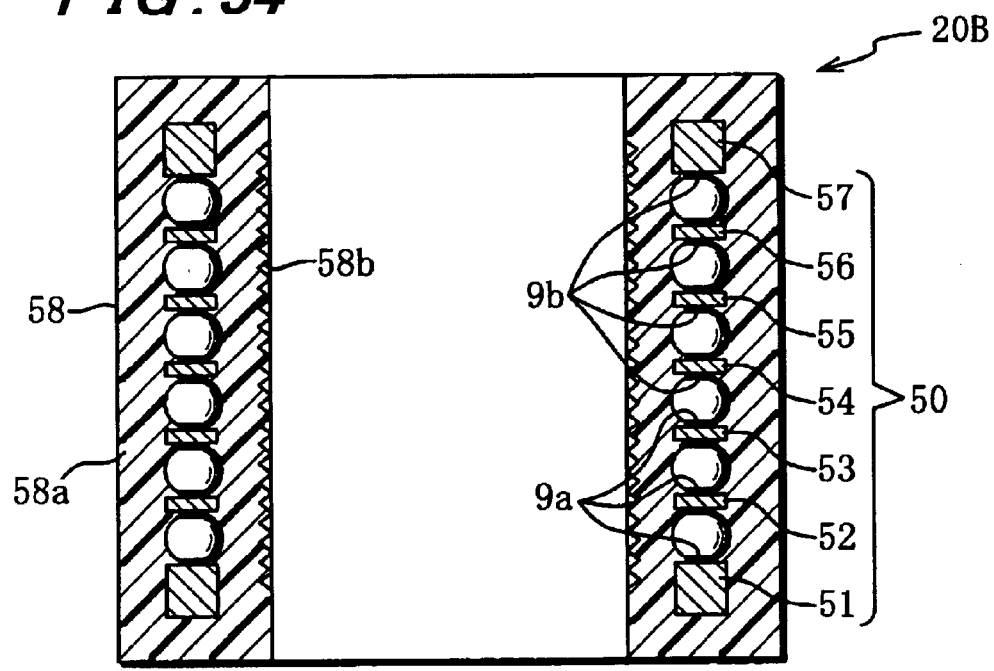

4) Alternative Embodiment 4 (FIG. 31–FIG. 34) Next, a semiconductor module 20B that has light-receiving functions and that uses the semiconductor device 10 will be described. Referring to FIG. 33 and FIG. 34, this semiconductor module 20B includes, for example: 72 (12×6) particle-shaped semiconductor devices 10 having light-receiving properties; a conductor mechanism 50 containing eight metal ring-shaped lead frames 51–57; and a light-transmitting member 58. The 72 semiconductor devices 10 are divided into 12 columns with their conduction orientation aligned, and these are arranged in a ring pattern at equal intervals along the perimeter.

The conductive connector mechanism 50 includes: a ring-shaped lead frame 51 with a negative terminal 51a at the lowest level; intermediate ring-shaped lead frames 52–56; and an uppermost ring-shaped lead frame 57 with a positive electrode 57a. The ring-shaped lead frames 52–56 are flat and are formed from a similar material as the lead frame plates (21–26) from the embodiment described above. These are formed in rings with widths of 1.5 mm. The ring-shaped lead frames 51, 57 are formed from material similar to the lead frame plates (21–26) and have a thickness of approximately 1.0 mm.

Four negative electrode terminals 51a and four positive electrode terminals 57a are formed integrally with the ring-shaped lead frames 51, 57, respectively. In this conductive connector mechanism 50, the six semiconductor devices 10 in each column are electrically connected in series and the twelve semiconductor devices 10 in each ring are electrically connected in parallel.

The cylindrical light-transmitting member 58 is formed as a thick cylinder from a transparent synthetic resin such as acrylic or polycarbonate. The 12 column of semiconductor devices 10 arranged in a ring formation are embedded in the perimeter wall 58a of the light-transmitting member 58. An irregular reflection surface 58b is formed on the inner perimeter surface of the perimeter wall 58a of the light-transmitting member 58 to reflect the light transmitted through the perimeter wall 58a to the semiconductor devices 10 in an irregular manner. This irregular reflection surface 58b is formed from multiple small pyramidal surfaces.

A method for making this semiconductor module 20B will be described.

Figure 31:
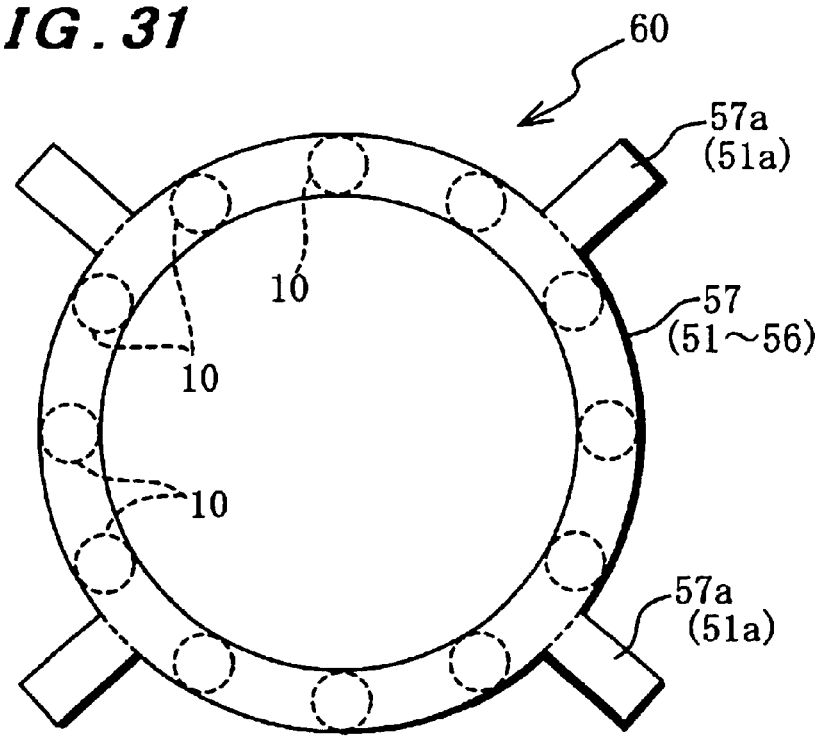
FIG. 31 through FIG. 34 show an alternative embodiment 4.
Figure 32:
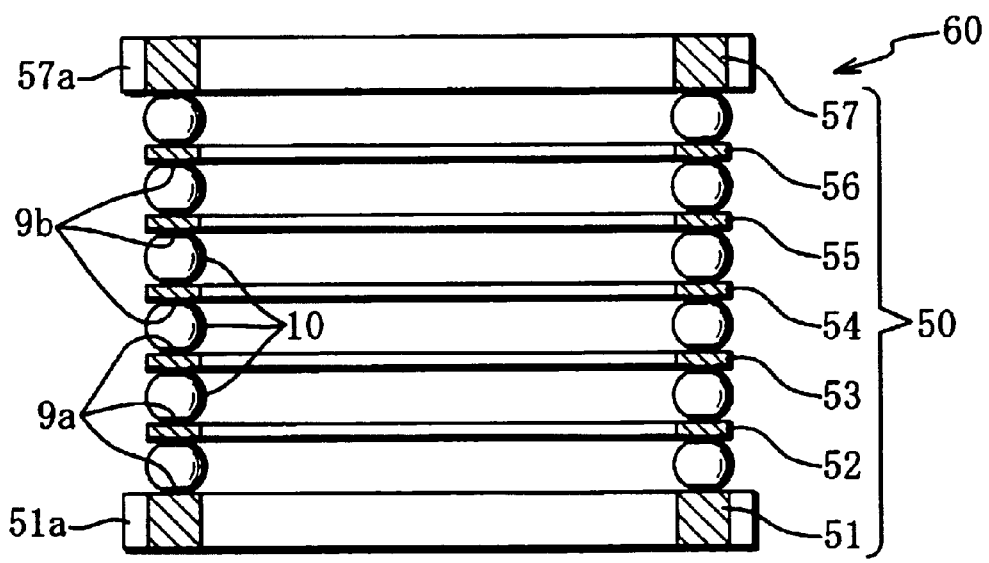

Referring to FIG. 31 and FIG. 32, the ring-shaped lead frames 51–57 and the 72 semiconductor devices 10 are made and prepared. Next, as in the making of the semiconductor module 20, 12 semiconductor devices 10 are arranged on the top surface of the ring-shaped lead frame 51 so that their negative electrodes 9a face down. A conductive adhesive is then used to bond the devices. Next, a conductive adhesive is applied to the positive electrodes 9b of the 12 semiconductor devices 10, and the ring-shaped lead frame 52 is mounted on top of this and bonded. This operation is repeated for ring-shaped lead frame 53–57. Referring to FIG. 32, there is shown the resulting structure. A predetermined weight is placed on top of the ring-shaped lead frame 57, and heat is applied to set the adhesive.

In other words, the 72 semiconductor devices 10 are placed with matching conductivity orientations between the ring-shaped lead frames 51–57, forming 12 columns arranged in a ring formation at uniform intervals along the perimeter. The six semiconductor devices 10 in each column are connected in series via the ring-shaped lead frames 51–57 while the 12 semiconductor devices 10 in each ring are connected in parallel via the ring-shaped lead frames 51–57. Referring to FIG. 31 and FIG. 32, this results in an assembly 60.

Next, the assembly 60 is placed in a predetermined molding die, which is then filled with a transparent synthetic resin. Referring to FIG. 33 and FIG. 34, the light-transmitting member 58 is formed as a result in the form of a thick transparent synthetic resin cylinder. The twelve columns of semiconductor devices 10 are embedded in the perimeter wall 58a of the cylindrical light-transmitting member 58 formed from transparent synthetic resin.

Since this semiconductor module 20B is formed as a cylinder, sun light from any direction can be reliably photoelectrically converted to generate approximately 3.6 volts between the negative electrode terminal 51a and the positive electrode terminal 57a. Since the irregular reflection surface 58b is formed on the inner perimeter surface of the light-transmitting member 58, the photo-electric conversion efficiency is improved. The difference between the outer diameter and the inner diameter of the light-transmitting member 58 causes light with a large incidence angle to go around inside the perimeter wall 58a so that it is guided to a semiconductor device 10 that is far away.

Next, various modifications that can be implemented in the embodiments described above will be described.

(1) Instead of silicon, the semiconductor used in the semiconductor elements 1, 41 can be, for example, a mixed crystal semiconductor formed from Si and Ge, a multi-layer semiconductor, or any one of a semiconductor selected from GaAs, InP, GaP, GaN, InCuSe, or the like. Or a different type of semiconductor can be used.

(2) The semiconductor elements 1, 41 do not have to be p-type and can be n-type. In such cases, p-type diffusion layers would be formed.

(3) The diffusion layers 3, 44 and the pn junction 4, 45 can be formed using another semiconductor film forming method, e.g., chemical vapor deposition (CVD).

(4) The reflection prevention films 6a, 46 can be an insulative film other than silicon oxide film, e.g., titanium oxide. Also, when forming the electrodes 9a, 9b, 49a, 49b, a metal paste other than silver paste can be used as the electrode material, e.g., aluminum or gold. When bonding the semiconductor devices 10 to the lead frame 29, solder can be used in place of a conductive resin.

(5) Instead of using a light-transmitting member in the semiconductor modules 20, 20A, a reinforcement glass can be mounted on either side of the semiconductor module, transparent ethylene vinyl acetate (EVA) resin or the like can be poured between the reinforcement glasses, and the ends can be sealed.

(6) In place of the semiconductor devices 10, the semiconductor modules 20, 20A, 20B can use the semiconductor device 10A, 10B, or 10C.

The number or arrangement of the semiconductor devices mounted on the semiconductor modules 20, 20A, 20B are not restricted to what is described in the above embodiments and can be defined freely.

(7) The semiconductor modules described above are presented as semiconductor modules having light-receiving functions. However, the semiconductor module of the present invention can be implemented in a similar manner for semiconductor modules having light-emitting functions. In such cases, semiconductor devices having light-emitting functions (spherical semiconductor devices, cylindrical semiconductor devices, or particle-shaped semiconductor devices) must be used.

For these light-emitting semiconductor devices, the various types of spherical light-emitting diodes proposed by the present inventor in WO98/15983 and WO99/10935 can be used, as well as various other types of light-emitting diodes.

These types of semiconductor modules with light-emitting functions can be used in planar illumination devices, various types of display devices, e.g., monochrome and color displays, and the like.

(8) The present invention is not restricted to the embodiments described above, and various other modifications can be made to the embodiments without departing from the spirit of the present invention.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed:

1. A light-emitting or light-receiving semiconductor device comprising:

a roughly spherical semiconductor element formed from one of a p-type and a n-type semiconductor, said semiconductor element being formed with parallel first and second flat surfaces at ends on either side of a center thereof;

a diffusion layer formed on a surface section of said semiconductor element including said first flat surface;

a roughly spherical pn junction formed on said diffusion layer; and first and second electrodes disposed on said first and said second flat surfaces respectively and connected to ends of said pn junction.

2. A light-emitting or light-receiving semiconductor device, according to claim 1, wherein an average diameter of said first and said second flat surfaces is smaller than a distance between said flat surfaces.

3. A light-emitting or light-receiving semiconductor device, according to claim 1, wherein said first and said second flat surfaces are formed with different diameters.

4. A light-emitting or light-receiving semiconductor device, according to claim 2, wherein said semiconductor element is made from a spherical semiconductor element.

5. A light-emitting or light-receiving semiconductor device as described in claim 2 wherein said semiconductor element is a single crystal semiconductor.

6. A light-emitting or light-receiving semiconductor device as described in claim 2 wherein said semiconductor element is a silicon semiconductor.

7. A light-emitting or light-receiving semiconductor device as described in claim 2 wherein said semiconductor element is a mixed-crystal silicon and germanium semiconductor.

8. A light-emitting or light-receiving semiconductor device as described in claim 2 wherein said semiconductor element is a compound semiconductor formed from at least one of a group consisting of GaAs, InP, GaP, GaN, and InCuSe.

9. A light-emitting or light-receiving semiconductor device as described in claim 2 wherein:

said semiconductor element is formed from a p-type semiconductor;

said diffusion layer is formed from an n-type diffusion layer;

a p-type diffusion layer is formed on said second flat surface; and a said second electrode is disposed on a surface of said p-type diffusion layer.

10. A light-emitting or light-receiving semiconductor device as described in claim 2 wherein:

said semiconductor element is formed from an n-type semiconductor;

said diffusion layer is formed from a p-type diffusion layer;

an n-type diffusion layer is formed on said second flat surface; and said second electrode is disposed on a surface of said n-type diffusion layer.

11. A light-emitting or light-receiving semiconductor device comprising:

a cylindrical semiconductor element formed from one of a p-type and n-type semiconductor, said semiconductor element being formed with parallel first and second flat surfaces at ends of said element and perpendicular to an axis thereof;

a diffusion layer formed on a surface section of said semiconductor element including said first flat surface;

a roughly cylindrical pn junction formed on said diffusion layer; and first and second electrodes disposed on said first and said second flat surfaces respectively and connected to ends of said pn junction.

12. A light-emitting or light-receiving semiconductor device, according to claim 11, wherein an average diameter of said first and said second flat surfaces is smaller than a distance between said flat surfaces.

13. A light-emitting or light-receiving semiconductor device as described in claim 12 wherein said semiconductor element is a single crystal semiconductor.

14. A light-emitting or light-receiving semiconductor device as described in claim 12 wherein said semiconductor element is a silicon semiconductor.

15. A light-emitting or light-receiving semiconductor device as described in claim 12 wherein said semiconductor element is a mixed-crystal silicon and germanium semiconductor.

16. A light-emitting or light-receiving semiconductor device as described in claim 12 wherein said semiconductor element is a compound semiconductor formed from at least one of a group consisting of GaAs, InP, GaP, GaN, and InCuSe.

17. A light-emitting or light-receiving semiconductor device as described in claim 12 wherein:

said semiconductor element is formed from a p-type semiconductor;

said diffusion layer is formed from a n-type diffusion layer;

a p-type diffusion layer is formed on said second flat surface; and a second electrode is disposed on a surface of said p-type diffusion layer.

18. A light-emitting or light-receiving semiconductor device as described in claim 12 wherein:

said semiconductor element is formed from a n-type semiconductor;

said diffusion layer is formed from a p-type diffusion layer;

a n-type diffusion layer is formed on said second flat surface; and a second electrode is disposed on a surface of said n-type diffusion layer.

19. A method for making a light emitting or light-receiving semiconductor device comprising:

a first step for making a spherical semiconductor element formed from one of a p-type and n-type semiconductor;

a second step for forming a first flat surface at an end of said semiconductor element;

a third step for forming on a surface section of said semiconductor element including said first flat surface a diffusion layer from a conductor different from said semiconductor element and a roughly spherical pn junction on said diffusion layer;

a fourth step for forming a second flat surface by removing said diffusion layer, said flat surface being parallel to said first flat surface and positioned opposite from said first flat surface of said semiconductor element; and a fifth step for forming a first and a second electrode on said first and said second flat surface respectively, said first and said second electrodes being connected to ends of said pn junction.

20. A method for making a light emitting or light-receiving semiconductor device comprising:

a first step for making a spherical semiconductor element formed from a p-type semiconductor;

a second step for forming parallel first and second flat surfaces on either end of a center of said semiconductor element;

a third step for forming on a surface section of said semiconductor element including said first flat surface and said second flat surface a n-type diffusion layer and a roughly spherical pn junction on said diffusion layer; and a fourth step for forming a first and a second electrode on said first and said second flat surface respectively, said first and said second electrodes being connected to ends of said pn junction.

21. A method for making a light emitting or light-receiving semiconductor device as described in claim 20, wherein in said fourth step, a small piece of at least one of a group consisting of Al, AuGa, and AuB is placed in contact with said second flat surface and heated and fused to form a p-type recrystallized layer passing through said diffusion layer and a second electrode continuous with said recrystallized layer.

22. A method for making a light emitting or light-receiving semiconductor device comprising:

a first step for making a cylindrical semiconductor element formed from at least one of a p-type and n-type semiconductor and forming parallel first and second flat surfaces at ends of said semiconductor element, said surfaces being perpendicular to an axis thereof;

a second step for forming on a surface section of said semiconductor element including said first flat surface a diffusion layer from a conductor different from said semiconductor element and a pn junction on said diffusion layer; and a third step for forming a first and a second electrode on said first and said second flat surface respectively, said first and said second electrodes being connected to ends of said pn junction.

23. A method for making a light emitting or light-receiving semiconductor device as described in claim 22 wherein in said third step, a small piece of at least one of a group consisting of Al, AuGa, and AuB is placed in contact with said second flat surface and heated and fused to form one of a p-type and an n-type recrystallized layer passing through said diffusion layer and a second electrode continuous with said recrystallized layer.

24. A light emitting or light receiving semiconductor device comprising:

a semiconductor element formed from one of a p-type and a n-type semiconductor, said semiconductor element being formed with parallel first and second flat surfaces at ends on either side of a center thereof;

said semiconductor element having a shape selected from the group comprising roughly spherical and cylindrical;

a diffusion layer formed on a surface section of said semiconductor element including said first flat surface;

a pn junction formed with said diffusion layer; and first and second electrodes disposed on said first and said second flat surfaces respectively and connected to ends of said pn junction.

25. A method for making a light emitting or light receiving semiconductor device comprising:

a first step for making a semiconductor element formed from one of a p-type and n-type semiconductor, said semiconductor element having a shape selected from the group comprising roughly spherical and cylindrical;

a second step for forming a first flat surface at an end of said semiconductor element;

a third step for forming on a surface section of said semiconductor element including said first flat surface a diffusion layer from a conductor different from said semiconductor element and a pn junction formed with said diffusion layer;

a fourth step for forming a second flat surface by removing said diffusion layer, said second flat surface being parallel to said first flat surface and positioned opposite from said first flat surface of said semiconductor element; and a fifth step for forming a first and a second electrode on said first and said second flat surface respectively, said first and said second electrodes being connected to end of said pn junction.

* * * * *